(12) United States Patent
Vashchenko et al.

(10) Patent No.: US 7,067,852 B1
(45) Date of Patent: Jun. 27, 2006

(54) ELECTROSTATIC DISCHARGE (ESD) PROTECTION STRUCTURE

(75) Inventors: Vladislav Vashchenko, Fremont, CA (US); Peter J. Hopper, San Jose, CA (US); Manuel Carneiro, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/660,386

(22) Filed: Sep. 12, 2000

(51) Int. Cl.
*H01L 29/74* (2006.01)
*H01L 23/62* (2006.01)

(52) U.S. Cl. ..................... 257/173; 257/355
(58) Field of Classification Search ........ 257/355–363, 257/173, 371, 373; 361/56
See application file for complete search history.

(56) References Cited

U.S. PATENT DOCUMENTS

| | | | | |
|---|---|---|---|---|
| 5,400,202 A | * | 3/1995 | Metz et al. | 361/56 |
| 5,572,394 A | * | 11/1996 | Ker et al. | 361/56 |
| 5,640,299 A | * | 6/1997 | Leach | 361/56 |
| 5,844,280 A | * | 12/1998 | Kim | 257/355 |
| 5,986,863 A | * | 11/1999 | Oh | 361/56 |
| 5,994,741 A | * | 11/1999 | Koizumi et al. | 257/355 |
| 6,011,681 A | * | 1/2000 | Ker et al. | 361/111 |
| 6,538,266 B1 | * | 3/2003 | Lee et al. | 257/173 |
| 6,891,206 B1 | * | 5/2005 | Czech et al. | 257/141 |

FOREIGN PATENT DOCUMENTS

JP     2-28348    * 1/1990

* cited by examiner

*Primary Examiner*—Ori Nadav
(74) *Attorney, Agent, or Firm*—Mark C. Pickering

(57) ABSTRACT

An ESD protection structure includes a semiconductor substrate of a first conductivity type, and first and second well regions of a second conductivity type disposed in the substrate. The first and second well regions are separated by a gap region of the substrate. Also included are first and second floating regions (of the second conductivity type) disposed in the first and second well regions adjacent to the gap region, respectively. The ESD protection structure also includes first and second contact regions of the first conductivity type disposed on the first and second well regions, respectively, and spaced apart from the first and second floating regions, respectively. The ESD protection structure also includes first and second contact regions of the second conductivity type disposed on the first and second well regions, respectively, and spaced apart from the first and second floating regions, respectively.

17 Claims, 1 Drawing Sheet

ELECTROSTATIC DISCHARGE (ESD) PROTECTION STRUCTURE

BACKGROUND OF THE INVENTION

1. Field of the Invention

The present invention relates to semiconductor device structures and, in particular, to electrostatic discharge protection structures for use with integrated circuits.

2. Description of the Related Art

Electrostatic discharge (ESD) protection devices are commonly employed in an integrated circuit (IC) to protect electronic devices in the IC from spurious pulses of excessive voltage (e.g., an ESD event, Human Body Model [HBM] event, or Electrical Overstress [EOS] event). See, for example, S. M. Sze, *Electrostatic Discharge Damage*, in VLSI Technology, Second Edition, 648–650 (McGraw Hill, 1988). A variety of conventional ESD protection devices that make extensive use of diodes, metal-oxide-semiconductor field effect transistors (MOSFETs), and bipolar transistors are known in the field. For example, conventional ESD protection devices for use with CMOS integrated circuits include Grounded Gate MOS (GGMOS) ESD protection structures and Low Voltage Silicon Controlled Rectifier (LVSCR) ESD protection structures. Descriptions of these and other conventional ESD protection structures are available in Haigang, et al., *A Comparison Study of ESD Protection for RFICs: Performance vs. Parasitics*, 2000 IEEE Radio Frequency Integrated Circuits Symposium, 235–237 (2000); U.S. patent application for "MOSFET Structure For Use in ESD Protection Devices" (filed Jul. 17, 2000; application number not yet assigned) and U.S. patent application Ser. No. 09/205,110 (filed Dec. 3, 1998), each of which is hereby fully incorporated by reference.

Conventional MOSFET structures are designed to exhibit breakdown characteristics only at voltages well above their standard operating supply voltage. However, during an ESD event, GGMOS ESD structures exhibit current conduction via a parasitic lateral bipolar mechanism. For a further description of current conduction in GGMOS ESD structures via a parasitic lateral bipolar mechanism, see E. A. Amerasekera et al., *ESD in Silicon Integrated Circuits*, sections 3.5.2 and 3.6 (John Wiley & Sons, 1995), which are hereby fully incorporated by reference.

ESD events can be of either a negative polarity or a positive polarity. Conventional GGMOS or LVSCR ESD protection structures can only protect electronic devices in an IC from a single polarity ESD event. Thus, two such structures are required to protect electronic devices in an IC from ESD events of both polarities.

The ESD protection capability of ESD protection devices is characterized by their snapback holding voltage and their maximum snapback current. ESD protection capability is improved at lower snapback holding voltages and higher maximum snapback current. Conventional GGMOS and LVSCR ESD protection structures operate via an avalanche-injection conductivity modulation mechanism. This mechanism, however, provides a relatively high snapback holding voltage and a relatively low snapback current.

Still needed in the field, therefore, is an ESD protection structure that can protect electronic devices in an IC from ESD events of both positive and negative polarities, has a low snapback holding voltage and a high maximum snapback current.

SUMMARY OF THE INVENTION

The present invention provides an ESD protection structure for use with ICs that can protect electronic devices in an IC from ESD events of both positive and negative polarities, has a low snapback holding voltage and a high maximum snapback current.

ESD protection structures for use with ICs according to the present invention include a semiconductor substrate (e.g., a silicon substrate) of a first conductivity type (typically P-type), a first well region of a second conductivity type (typically N-type) disposed in the semiconductor substrate, and a second well region, also of the second conductivity type, disposed in the semiconductor substrate. The first and second well regions are separated by a gap region of the first conductivity type that is disposed in the semiconductor substrate.

Also included in ESD structures according to the present invention are a first floating region and a second floating region, each of the second conductivity type, disposed in the first well region and second well region respectively. The first and second floating regions are adjacent to the gap region. The ESD structures further include first and second contact regions of the first conductivity type disposed on the first and second well regions, respectively, and spaced apart from the first and second floating regions, respectively. In addition, the ESD structures include first and second contact regions of the second conductivity type that are also disposed on the first and second well regions, respectively, and also spaced apart from the first and second floating regions, respectively.

ESD protection structures according to the present invention can be thought of as a variant of a DIAC structure that provides ESD protection capability by the distinctive addition of first and second floating regions, and a P-type contact region and an N-type contact region in each of the first and second well regions.

During operation, ESD protection structures according to the present invention undergo primary breakdown via a low current avalanche breakdown mechanism in the gap region between the first and second floating regions. Following this low current avalanche breakdown, and when the current has exceeded a critical switching value, the ESD protection structures exhibit "double injection" of holes and electrons from an N-type and a P-type contact region, one in each of the first and second well regions, to attain a high maximum snapback current. This high maximum snapback current is attributed to mutual space charge neutralization and conductivity modulation in the gap region (and an associated reduction in the electric field).

An advantage of ESD protection structures according to the present invention is that they are symmetrical (i.e., each of the first and second well regions has both an N-type contact region and a P-type contact region disposed therein). The ESD protection structures can, therefore, protect electronic devices in an IC from ESD events of both a negative and a positive polarity. ESD protection structures according to the present invention can be manufactured using conventional semiconductor manufacturing process techniques (e.g., 0.18 micron CMOS process technologies) and are, therefore, compatible for use with CMOS integrated circuits.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which.

DETAILED DESCRIPTION OF THE INVENTION

To be consistent throughout the present specification and for clear understanding of the present invention, the following definitions are provided for terms used therein:

The terms "dopant" and "dopants" refer to donor and acceptor impurity atoms (e.g., boron [B], phosphorous [P], arsenic [As] and indium [In]), which are intentionally introduced into a semiconductor substrate (e.g., a silicon wafer) in order to change the substrate's charge-carrier concentration. See, R. S. Muller and T. I. Kamins, *Device Electronics for Integrated Circuits 2nd Edition*, 11–14 (John Wiley and Sons, 1986) for a further description of dopants.

Figure 1:
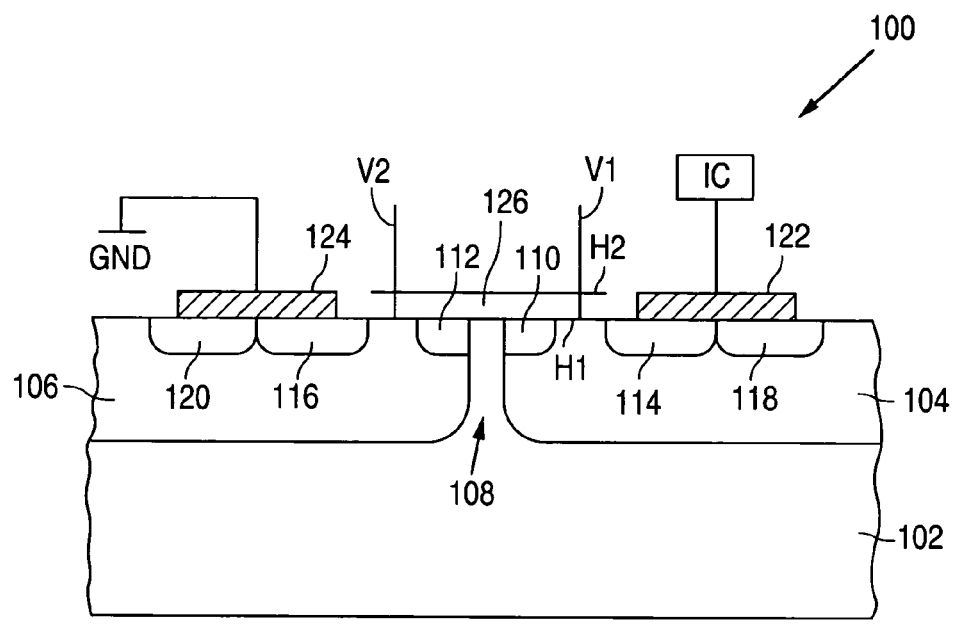
FIG. 1 is a combined cross-sectional and electrical schematic depiction of an ESD protection structure in accordance with the present invention.

FIG. 1 illustrates an ESD protection structure 100 for use with ICs according to the present invention. ESD protection structure 100 includes a P-type semiconductor substrate 102 (e.g., a P-type silicon substrate, a P-type epitaxial silicon substrate or a high resistance P-type silicon substrate). The dopant concentration in the semiconductor substrate 102 can be any conventional concentration known in the art. ESD protection structure 100 also includes a first N-type well region 104 and a second N-type well region 106 disposed in the semiconductor substrate 102. The dopant concentrations of the first and second N-type well regions are essentially identical. The dopant concentrations and dimensions of the first and second N-type well regions depend on the semiconductor manufacturing process technology employed to create the ESD protection structure. A typical dopant concentration for ESD protection structures created with an 0.18 micron CMOS process technology is, however, in the range of 1E17 atoms/cm$^2$ to 1E20 atoms/cm$^2$, while a typical depth of the first and second N-type well regions is 1.25 microns.

The first N-type well region 104 and second N-type well region 106 are separated by a P-type gap region 108 disposed in the semiconductor substrate 102. For a 0.18 micron CMOS process technology, the P-type gap region 108 separates the first N-type well region 104 from the second N-type well region 106 by a minimum distance in the range of 0.18 microns to 0.25 microns. The P-type gap region 108 functions as a discharge space during an ESD event.

Also included in ESD protection structure 100 are a first N-type floating region 110 disposed in the first N-type well region 104 adjacent to the P-type gap region 108 and a second N-type floating region 112 disposed in the second N-type well region 106 adjacent to the P-type gap region 108. The dopant concentrations of the first and second N-type floating regions 110, 112 are greater than that of the first and second N-type well regions 104, 106. The first and second N-type floating regions 110, 112, therefore, provide a sharp P/N junction between themselves and the P-type gap region 108. This sharp P/N junction provides an ESD protection structure 100 with a low trigger voltage (e.g., a trigger voltage in the range of 6 volts to 8 volts). In the absence of first and second N-type floating regions 110, 112, the trigger voltage would be unacceptably high (e.g., in the range of 15 volts to 25 volts) due to the presence of only the relatively smooth P/N junctions that are formed between the N-type well regions and the P-type gap region during conventional CMOS technology processing.

ESD protection structure 100 also includes four contact regions: (i) a first P-type contact region 114 disposed on the first N-type well region 104 that is spaced apart from the first N-type floating region 110; (ii) second P-type contact region 116 disposed on the second N-type well region 106 and spaced apart from the second N-type floating region 112; (iii) a first N-type contact region 118 disposed on the first N-type well region 104 and spaced apart from the first N-type floating region 110; and (iv) a second N-type contact region 120 disposed on the second N-type well region 106 and spaced apart from the second N-type floating region 112. The ESD protection structure 100 of FIG. 1 further includes a first electrical contact 122 connected to the first P-type contact region 114, the first N-type contact region 118, and an IC. For example, first electrical contact 122 can be connected to a line, pin or bus of an IC, for which ESD protection is desired. In addition, ESD protection structure 100 includes a second electrical contact 124 connected to the second P-type contact region 116, the second N-type contact region 120 and to ground (GND). First and second electrical contacts 122, 124 can be formed using conventional semiconductor manufacturing process techniques, including metal silicidation or metal deposition.

Further, a device region 126 of ESD protection structure 100 can be defined to extend from a first horizontal plane H1 to a second horizontal plane H2, and from a first vertical plane V1 to a second vertical plane V2. The first horizontal plane H1 lies on the top surface of semiconductor substrate 102, while the second horizontal plane H2 contacts the top surfaces of the first and second electrical contacts 122 and 124. In addition, the first vertical plane V1 contacts the top surface of semiconductor substrate 102 between region 110 and region 114, while the second vertical plane V2 contacts the top surface of semiconductor substrate 102 between region 112 and region 116.

As shown in FIG. 1, device region 126 overlies and contacts gap region 108, is totally free of a conductive material, such as the gate of a MOS transistor, and does not lie below a gate. Further, device region 126 can alternately be defined to have a smaller size, but always contacts the top surface of semiconductor substrate 102 and gap region 108.

During an ESD event, an ESD pulse arriving at the first electrical contact 122 will provide a low level of current flow across the P-type gap region 108. This low level of current flow initiates primary breakdown of the ESD protection structure 100 via low current avalanche breakdown of the P-type gap region 108 between the first N-type floating region 110 and the second N-type floating region 112. This avalanche breakdown occurs at a trigger voltage that is dependent on the dopant profiles of the first and second N-type floating regions 110, 112 and the P-type gap region 108, as well as the separation distance between the first N-type well region 104 and the second N-type well region 106.

The structural arrangement of the first and second N-type floating regions 110, 112 and the P-type gap region 108 creates an NPN sub-structure in the center of the ESD protection structure 100. Since the distance separating the first and second N-type floating regions 110, 112 (i.e., the width of the P-type gap region 108) is relatively short, the space charge region available in the P-type gap region 108 is limited by the presence of the first and second N-type well regions 104, 106. The breakdown voltage of the P-type gap region 108 is, therefore, to an extent proportional to the separation between the first and second N-type well regions 104, 106 (i.e., to the width of the P-type gap region 108). Therefore, the triggering voltage of the ESD protection structure can be tuned to suit particular needs by providing a gap region of the appropriate width.

As the ESD event continues, the current increases to a critical switching level whereupon the ESD protection structure enters a switching state. In the switching state, "double injection" occurs from a single contact region in both of the N-type well regions. By providing both a P-type contact region and an N-type contact region in each N-type well region (i.e., by providing "double junctions"), ESD protection structures according to the present invention are capable of operating via a "double injection" mechanism. This "double injection" mechanism involves the injection of both holes and electrons, one from each side of the ESD protection structure, regardless of the polarity of an ESD pulse. In other words, depending on the polarity of ESD event, either holes are injected from the first P-type contact region or electrons are injected from the first N-type contact region. At the same time, however, either electrons are injected from the second N-type contact region or holes are injected from the second P-type contact region. This double injection (i.e., the injection of holes from a contact region in one of the well regions, while the injection of electrons occurs from a contact region in the other well region) results in mutual space charge neutralization (i.e., the positive and negative currents of the holes and electrons compensate one another). This mutual space charge neutralization results in a conductivity modulation in the gap region (and an associated reduction in the electric field) that supports the attainment of relatively high maximum snapback currents.

ESD protection structures for use with ICs according to the present invention can, if desired, be formed with the first and second N-type well regions in an elongated "finger" arrangement (with a finger length of, for example 50 microns to 100 microns) or as multiple connected fingers.

Figure 2:
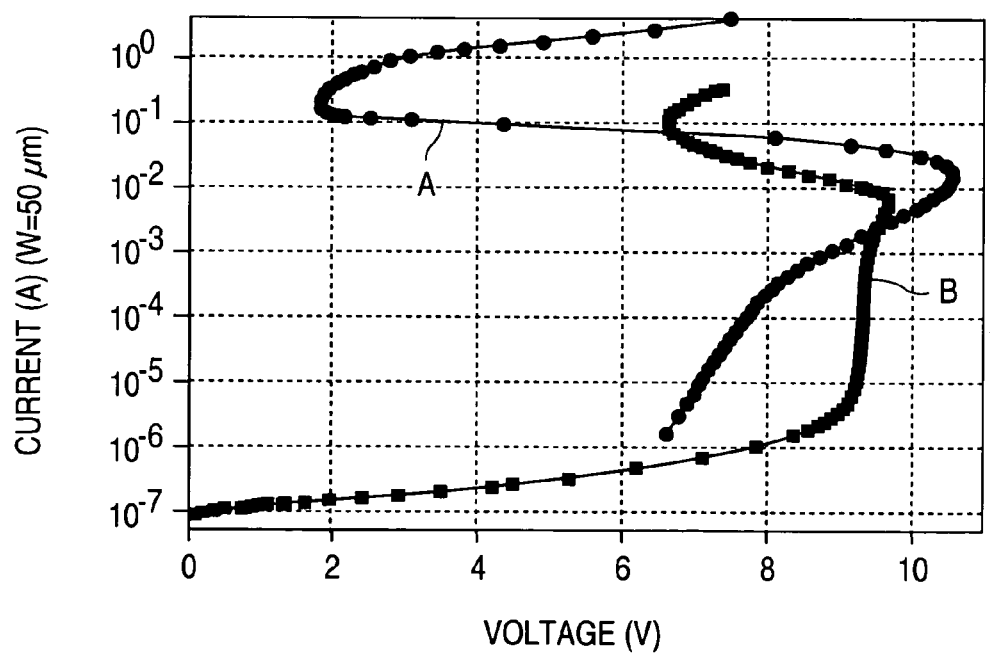
FIG. 2 is a current versus voltage (I-V) graph illustrating the simulated electrical behavior of an ESD protection structure according to the present invention formed using a 0.18 micron CMOS process technology (curve A) and a conventional GGMOS ESD protection structure formed using the same 0.18 micron CMOS process technology (curve B).

FIG. 2 illustrates the I-V characteristics obtained from a numerical simulation for an ESD protection structure according to the present invention formed using a 0.18 micron CMOS process technology (curve A), and a conventional GGMOS ESD protection structure formed using the same 0.18 micron CMOS process technology (curve B). The current represented in FIG. 2 is, for the case of the conventional GGMOS, drain current and, for the case of ESD protection structures according to the present invention, the current through the second well region. The voltage represented in FIG. 2 is, for the case of the conventional GGMOS, the drain-to-source voltage and, for the case of ESD protection structures according to the present invention, the voltage between the first and second well regions.

For the conventional GGMOS ESD protection structure of FIG. 2, the snap-back holding voltage is approximately 6 volts. For the ESD protection structure according to the present invention, however, the snap-back holding voltage is less than 2 volts. In addition, the maximum snapback current for the ESD protection structure according to the present invention is 8 to 10 times greater than that of the conventional GGMOS ESD protection structure. The lower snap-back holding voltage and higher maximum snapback current of ESD protection structures according to the present invention, therefore, provide an increase in ESD protection capability of approximately 10 times. This 10-fold increase in ESD protection capability allows the use of ESD protection structures of 10 times less area to obtain the same level of ESD protection (e.g., protection against a 2–4 KeV pulse) as a conventional GGMOS ESD protection structure or the provision of increased ESD protection for an ESD protection device of the same area.

It should be understood that various alternatives to the embodiments of the invention described herein may be employed in practicing the invention. It is intended that the following claims define the scope of the invention and that structures within the scope of these claims and their equivalents be covered thereby.

What is claimed is:

1. A device formed in a semiconductor material of a first conductivity type, the semiconductor material having a surface, the device comprising:
    a first well of a second conductivity type formed in the semiconductor material, the first well having a dopant concentration;
    a second well of the second conductivity type formed in the semiconductor material, the second well having a dopant concentration and being spaced apart from the first well;
    a first contact region of the first conductivity type formed in the first well;
    a second contact region of the second conductivity type formed in the first well, the second contact region being electrically connected to the first contact region to have a same potential;
    a first trigger region of the second conductivity type formed in the first well, the first trigger region being spaced apart from the first and second contact regions;
    a third contact region of the first conductivity type formed in the second well;
    a fourth contact region of the second conductivity type formed in the second well, the fourth contact region being electrically connected to the third contact region to have a same potential;
    a second trigger region of the second conductivity type formed in the second well, the second trigger region being spaced apart from the third and fourth contact regions;
    a separation region of the semiconductor material located only between the first and second trigger regions, the separation region contacting the surface, the first trigger region, and the second trigger region, the separation region having only the first conductivity type; and
    a device region that overlies and contacts the surface at a location where the separation region contacts the surface between the first and second trigger regions, the device region at the location being free of a gate, and not lying below a gate.

2. The device of claim 1 wherein the first and second trigger regions are formed on opposite sides of the separation region.

3. The device of claim 1 wherein
    the first trigger region has a dopant concentration greater than the dopant concentration of the first well; and
    the second trigger region has a dopant concentration greater than the dopant concentration of the second well.

4. The device of claim 1 wherein the first trigger region is not directly electrically connected to the third contact region, and the second trigger region is not directly electrically connected to the first contact region.

5. The device of claim 1 wherein
the first trigger region adjoins the semiconductor material; and
the second trigger region adjoins the semiconductor material.

6. The device of claim 1 wherein during a first ESD event, a first potential on the first and second contact regions is greater than a second potential on the third and fourth contact regions.

7. The device of claim 6 wherein during a second ESD event, a third potential on the third and fourth contact regions is greater than a fourth potential on the first and second contact regions.

8. The device of claim 1 wherein
the semiconductor material has a top surface;
the first well has a side surface that contacts the top surface, and a bottom surface that contacts the side surface; and
the first trigger region is spaced apart from the bottom surface.

9. A device comprising:
a semiconductor region of a first conductivity type, the semiconductor region having a top surface;
a first well of a second conductivity type that contacts the semiconductor region;
a first connection region of the first conductivity type that contacts the first well;
a second connection region of a second conductivity type that contacts the first well, the second connection region being electrically connected to the first connection region to have a same potential;
a first trigger region of the second conductivity type that contacts the first well and the semiconductor region, the first trigger region being spaced apart from the first and second connection regions, and having a dopant concentration that is substantially greater than a dopant concentration of the first well;
a second well of the second conductivity type that contacts the semiconductor region;
a third connection region of the first conductivity type that contacts the second well;
a fourth connection region of the second conductivity type that contacts the second well, the fourth connection region being electrically connected to the third connection region to have a same potential;
a second trigger region of the second conductivity type that contacts the second well and the semiconductor region, the second trigger region being spaced apart from the first trigger region and the third connection region, and having a dopant concentration that is substantially greater than a dopant concentration of the second well, no region of the second conductivity type lying between the first and second trigger regions; and
a device region that overlies and contacts only the top surface of the semiconductor region between the first and second trigger regions, the device region being free of a gate, and not lying below a gate.

10. The device of claim 9 wherein the fourth connection region is spaced apart from the second trigger region.

11. The device of claim 10 wherein the first, second, third, and fourth connection regions are spaced apart from the semiconductor region.

12. The device of claim 10 wherein the first connection region lies between the second connection region and the first trigger region.

13. The device of claim 12 wherein the third connection region lies between the fourth connection region and the second trigger region.

14. The device of claim 10 wherein during a first ESD event, a first potential on the first and second connection regions is greater than a second potential on the third and fourth connection regions.

15. The device of claim 14 wherein during a second ESD event, a third potential on the third and fourth connection regions is greater than a fourth potential on the first and second connection regions.

16. The device of claim 10 wherein:
the first trigger region is spaced apart from a bottom surface of the first well; and
the second trigger region is spaced apart from a bottom surface of the second well.

17. The device of claim 10 wherein the first trigger region is not directly electrically connected to the third connection region, and the second trigger region is not directly electrically connected to the first connection region.

* * * * *